United States Patent [19]

Meitner et al.

[11] Patent Number: 5,499,315
[45] Date of Patent: * Mar. 12, 1996

[54] ADAPTIVE DIGITAL AUDIO INTERPOLATION SYSTEM

[76] Inventors: Edmund Meitner, 4637 Mac Leod Tr. S.W., Calgary/Alberta, Canada; Robert P. Gendron, 64 Millpond Rd., N. Andover, Mass. 01845

[*] Notice: The portion of the term of this patent subsequent to Feb. 7, 2012, has been disclaimed.

[21] Appl. No.: 338,678

[22] Filed: Nov. 14, 1994

Related U.S. Application Data

[63] Continuation of Ser. No. 879,976, May 5, 1992, Pat. No. 5,388,221.

[51] Int. Cl.⁶ .............................. G10L 5/02; G10L 9/00

[52] U.S. Cl. .................. 395/2.74; 395/2.77; 395/2.67; 395/2

[58] Field of Search .................. 395/2, 2.1, 2.67, 395/2.74, 2.77; 381/31

[56] References Cited

U.S. PATENT DOCUMENTS 5,388,221  2/1995  Meitner et al. ................... 395/2.77

*Primary Examiner*—David K. Moore
*Assistant Examiner*—Tariq Rafiq Hafiz
*Attorney, Agent, or Firm*—Paul F. Schenck

[57] ABSTRACT

A transition signal detector switches the processing of a digital audio signal between a frequency optimized filter for normal operation and a transition optimized filter when a transition condition is detected.

2 Claims, 4 Drawing Sheets

5,499,315

ADAPTIVE DIGITAL AUDIO INTERPOLATION SYSTEM

This application is a continuation of application Ser. No. 07/879,976 filed on May 5, 1992, now U.S. Pat. No. 5,388,221.

TECHNICAL FIELD OF THE INVENTION

The adaptive digital audio interpolation system pertains to digital interpolators, and more particularly, to a system performing at increased data sampling rates without generation of ringing of oscillations at signal discontinuities otherwise known as Gibbs phenomena.

BACKGROUND OF THE INVENTION

Digital audio is recorded using digital sampling techniques at standard sample rates of 32 KHz, 44.1 KHz, or 48 KHz with maximum recordable frequencies of 16 KHz, 22.050 KHz, and 24 KHz, respectively. These limitations are known as Nyquist Criterion.

Playback of digital audio recreates the recorded audio data correctly up to the maximum frequency or Nyquist rate. In addition, an audio data image is also created. In a frequency spectrum, this image is the reverse of the original audio information offset by half the sample frequency, see FIG. 3. An increasing audio frequency signal generates decreasing frequency signal above half the sampling frequency i.e. a 20 KHz tone will create an image tone at 44.1 KHz–20 KHz=24.1 KHz, a 10 KHz tone will create an image tone at:

44.1 KHz–10 KHz=34.1 KHz.

The audio data image produced in playback must be removed in order to achieve acceptable playback of the original audio information. With the audio data image directly above the original audio data information, an analog filter with high filtering capability is needed to remove the audio data image. The audio data image can be shifted in frequency to a frequency span high above the original audio information to relax analog image removal filter requirements.

The audio data image is shifted in frequency by use of an upsampling interpolation digital filter or multirate filter. The multirate filter performs interpolation between data point of the original audio data by increasing the sampling rate. The increased sampling rate allows for filtering above the original Nyquist rate.

The multirate filter is required to have a cutoff at the Nyquist rate and maximum attenuation at the lowest possible audio data image. Audio material recorded at 44.1 KHz will have a maximum recorded frequency of 22.05 KHz and a minimum possible audio data image of 22.05 KHz. An image removal filter is required to have a passband of 20 KHz and a stopband of 22.05 KHz, with an attenuation in the stopband greater than 90 dB. Use of a digital filter with these specifications and an ending sampling rate of two times the original sampling rate (2 Fs) would create a possible minimum audio data image at 88.2 KHz–22.05 KHz=66.15 KHz.

The audio data image could be shifted to even higher frequencies of 4 Fs, 8 Fs, 16 Fs, 32 Fs, etc using additional multirate filtering.

It is however necessary to use multirate filtering at least at twice the original sample rate, which is the most critical and demanding filter. At 2 Fs the transition band is 22.05 KHz–20 KHz=2.5 KHz.

A 4 FS filter which is required to have a 20 KHz passband must filter the audio data image at 88.2 KHz–22.05 KHz=66.16 KHz, and has a transition band of 46.15 KHz. The 2 Fs filter is a factor of 12 worse than the 4 Fs filter. Higher filter rates have even larger transition bands. The extremely narrow transition band of the 2 Fs digital filter highlights the Gibbs phenomena.

The Gibbs Phenomena is the ringing effect which can be observed on transient responses of digital filters due to a finite window of points used to perform the multirate filtering. Gibbs phenomena creates a ringing distortion before and after a sharp transient. FIGS. 1a and 2a illustrate the effect of the ringing on a short positive going pulse and on a square wave signal. The pre-ringing distortion is highly audible in music passages and is the major audio difference between analog processed playback and digital playback.

DESCRIPTION OF THE INVENTION

A discontinuity detector scans the digital audio data ahead of the data entering the interpolation filter. If a transient pulse is detected, output data is taken from the transient optimized filter rather than from the frequency optimized filter. No transient detection causes the selection of the output data from the interpolation filter that is optimized for frequency response. The change in the selection of the output data starts well ahead of the time instant the transition is detected and stays until the window time is passed during which possible oscillations caused by a transition may occur. If a transient condition is detected during the time output data is taken from the transient optimized response filter, the window time is restarted.

A frequency optimized filter is designed for best possible frequency performance, i.e. gain is constant over frequency and phase is linear over frequency. The Filter structure is a Finite Impulse Response (FIR) where a finite limit of coefficients multiplied by a finite window of data points determines an interpolated point.

A transient optimized filter is designed for best possible transient performance, i.e. where gain and phase are most accurate for a transient response and not for the entire frequency range. Filter structure can be of FIR architecture or of Infinite Impulse Response (IIR) architecture.

The transient detector detects digital data discontinuities by examining the relative acceleration from data point to data point. Between every successive two data points, a difference value or delta value is determined and stored in a storage register. If the latest delta value multiplied with a scale value $\alpha$ exceeds the preceding delta value a discontinuity is detected. The use of a relative measure to detect transients allows for increased discrimination in transient detection at all magnitudes. The scale value $\alpha$ (alpha) is determined by the largest data point acceleration within the frequency optimized interpolation filter which does not produce oscillations. With $\alpha$ set accordingly, the detector will select output from the transient optimized filter rather than the frequency optimized filter which is known to ring for the given data acceleration. Therefore the α-term is dependent on the performance of the frequency optimized filter and on the filter sample rate.

The simplest application of discontinuity detection can be made by setting an absolute delta value that is not relative to the surrounding data.

FIGS. 1a, 1b, and 2a, 2b illustrate the processing of a short positive signal and a square wave signal in the interpolation system of the present invention.

SHORT DESCRIPTION OF THE DRAWINGS

DETAILED DESCRIPTION OF A FIRST PREFERRED EMBODIMENT

Figure 1A:
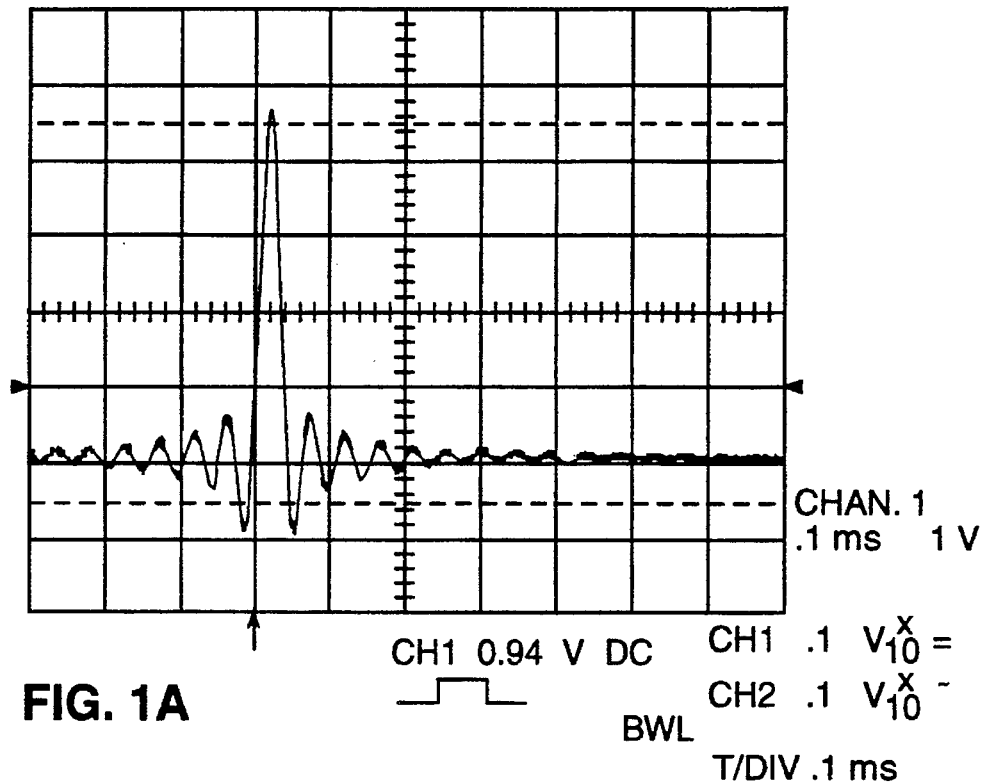
FIGS. 1a and 1b are illustrations of a short positive audio signal processed without and with transient interpolation filter.
Figure 1B:
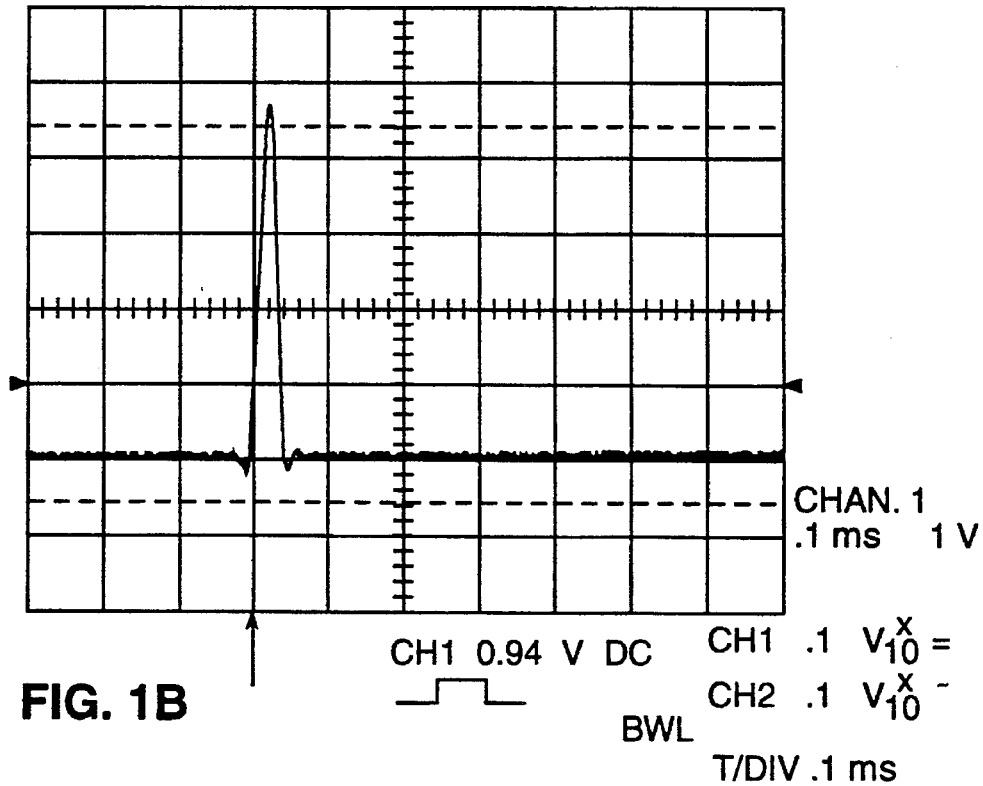
Figure 2A:
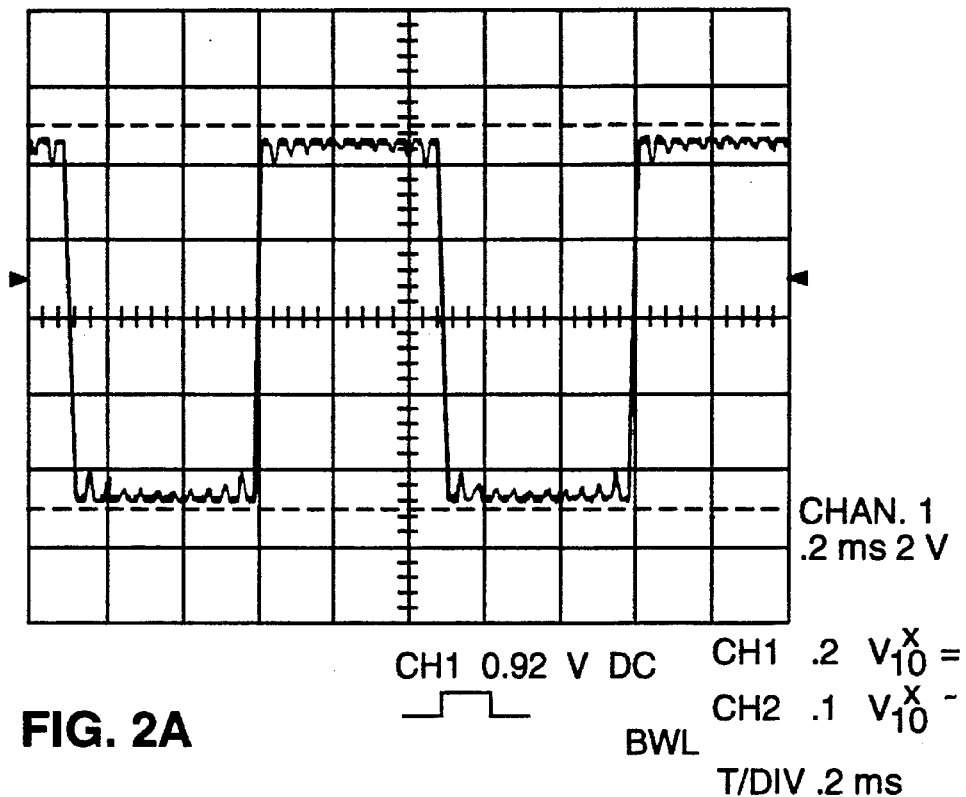
FIGS. 2a and 2b are illustrations of a square wave audio signal processed without and with transient interpolation filter.
Figure 2B:
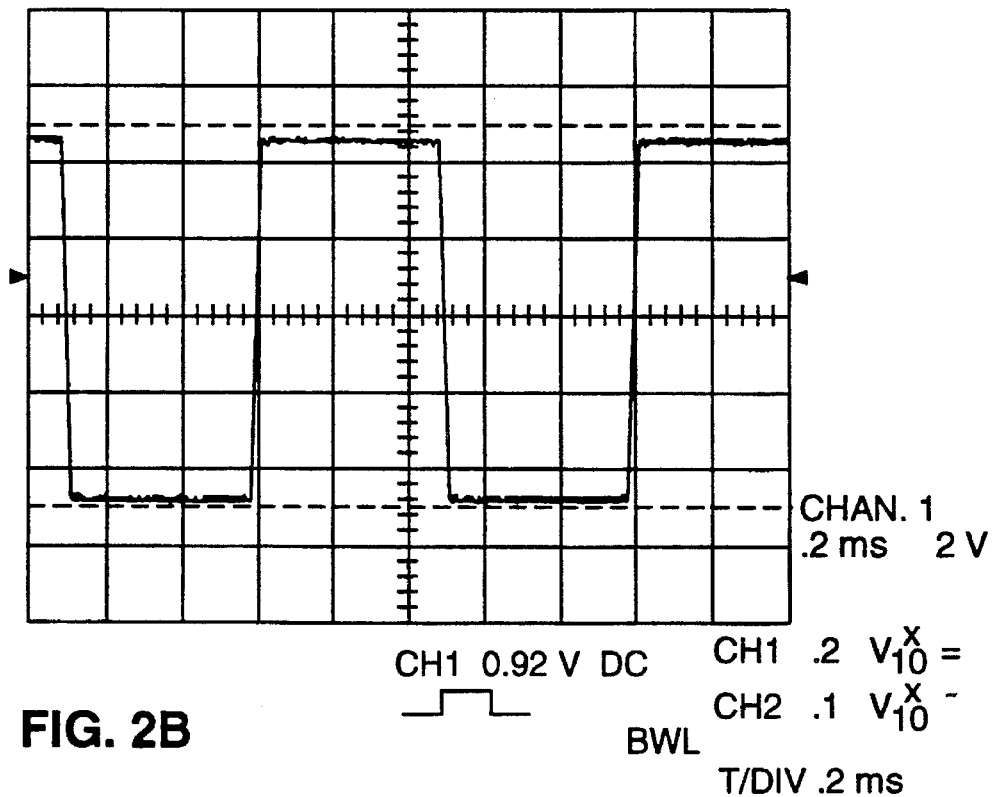
Figure 4:
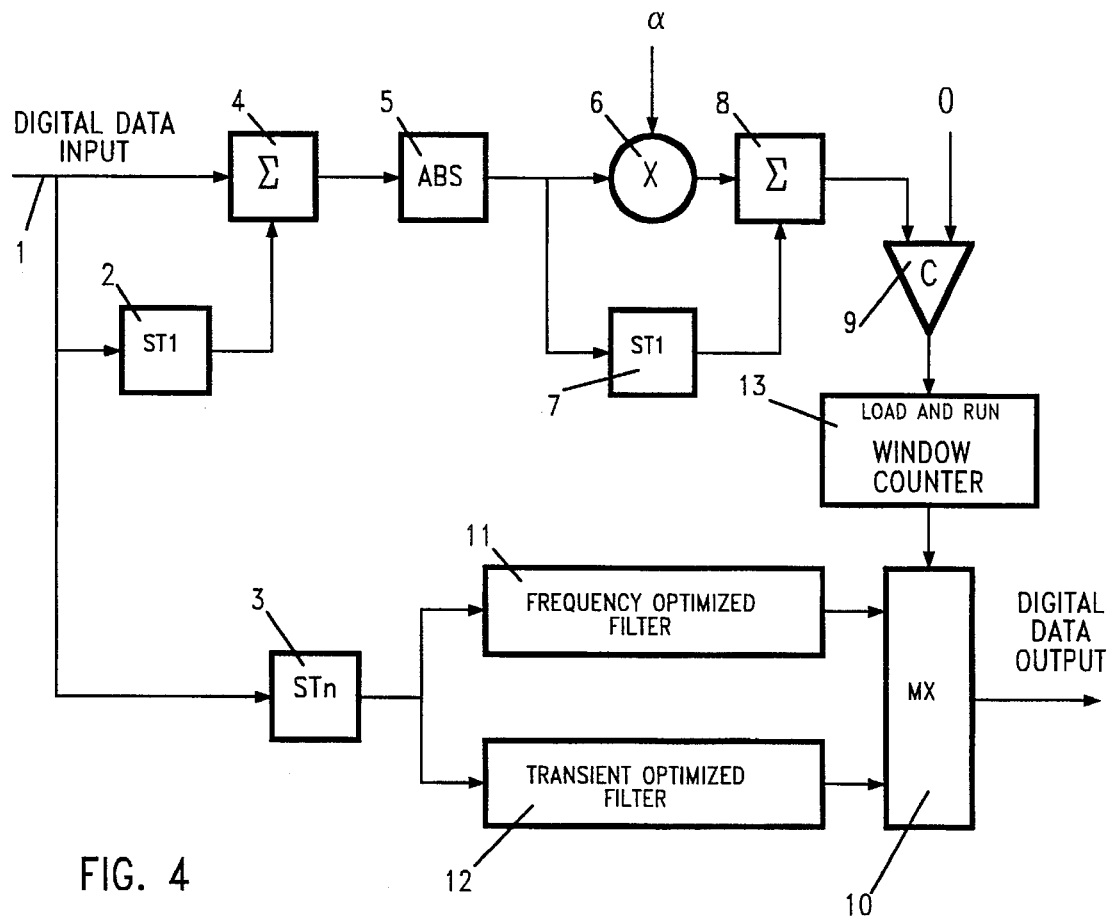
FIG. 4 is a blockdiagram of the adaptive digital audio interpolator system.
Figure 3:
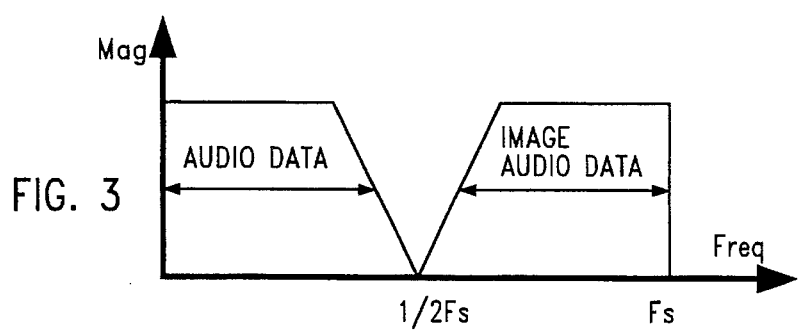
FIG. 3 is an illustration of the frequency spectrum of audio data and image audio data relative to the sampling frequency.

FIG. 4 is a blockdiagram of the adaptive digital audio interpolator system. Digital audio data arrive on input 1 and are supplied to a storage 2, a delay storage 3 and an adder 4. Each arriving digital audio value is compared in adder 4 with the preceding digital audio value stored in storage 2. The resultant difference represents the acceleration between the present digital audio value and the preceding digital audio value. The resultant difference is stripped of the magnitude sign in block 5. The unsigned or absolute difference value is stored in storage 7. The unsigned difference value is also scaled in multiplier 6 by a predetermined value α (alpha). The scaling factor α determines the level of detection for the discontinuity detector. The scaled unsigned difference value is fed into adder 8 and the preceding difference value taken from storage 7 is subtracted. The resultant value is compared with zero in a digital comparator 9 to determine whether the scaled difference value is larger than the preceding difference value. The output signal of comparator 9 is the controlling signal for multiplexer 10 for selecting either the digital audio signal from frequency optimized filter 11 or digital audio signal from transient optimized filter 12. To extend the output signal of comparator 9 over the time span or window during which frequency optimized filter may output a ringing signal window counter 13 is set to a value corresponding to the number of output data values to be selected from the transient optimized filter.

If a transient condition was detected window time counter 13 is set to a predetermined value and maintains the data selection from the transient optimized filter 12 for a number of digital audio data values corresponding to the predetermined value. This time span expressed in number of data values corresponds to the filter window of the frequency optimized interpolation filter during which ringing and oscillations may occur due to a transient condition. If during a window time another transient condition is detected, window counter 13 is reset and a new window time is started.

The data path from digital audio data input 1 to interpolation filters 11 and 12 is delayed in storage 3 by as many digital audio data values as are needed for the detector to successfully detect a transient. Frequency optimized filter 11 can consist of a Finite Impulse Response (FIR) filter or any filter structure that achieves the desired frequency response. Transient response filter 12 is also designed to a structure that will achieve the desired transient response. The filter structures may also utilize filter structures from each other to achieve the desired responses.

DESCRIPTION OF A SECOND PREFERRED EMBODIMENT

While the description of the first preferred embodiment relates to an hardware implementation of the present invention, it is possible to use properly operated signal processors or general purpose data processing means. In such implementations the storage may be represented by registers of a processor or part of a memory while the data manipulations are performed by one or more processors.

Figure 5:
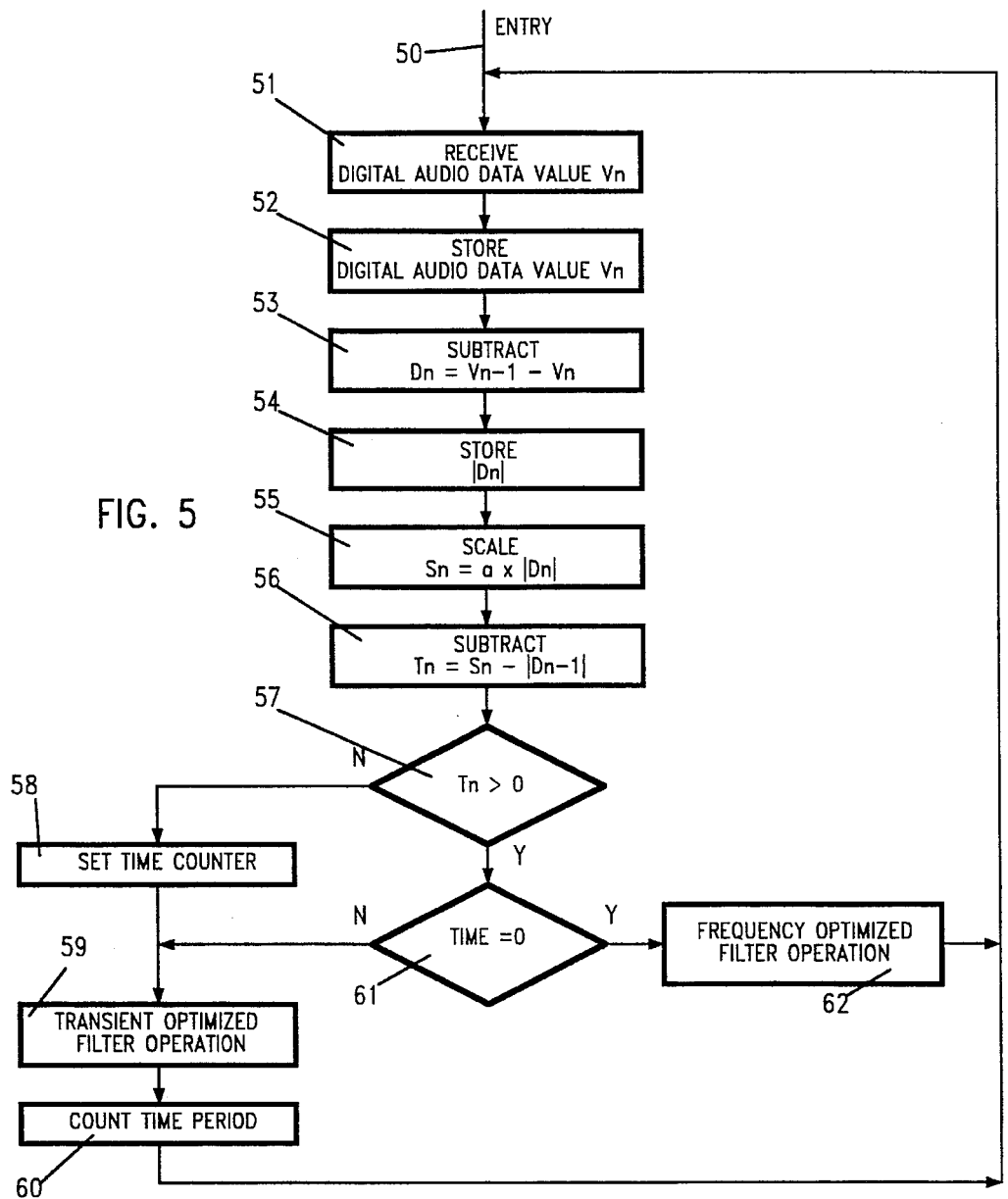
FIG. 5 is an operational flowchart of the adaptive digital audio interpolator system.

FIG. 5 is a schematic flowchart of a processor performing selectively a frequency or transient optimized filter operation depending on the received digital audio data values.

A digital audio data value Vn is received 51 and stored in a register or the like 52. The received data value Vn is also subtracted from the preceding digital audio data value Vn−1 53. The absolute value of the difference value Dn of the two successive data values Vn−1 and Vn is stored in another register or memory location 54. Scaling the absolute difference value |Dn| with a value α provides a value Sn 55. Filter selection signal Tn is generated by subtracting the preceding difference value , |Dn−1| from the present value Sn. If the result Tn is positive 57 and the window timer is set to ZERO the frequency optimized filter output is selected to supply processed digital audio signal 62. If the result Tn is negative 57 the window counter is activated to a predetermined value 58 and the transient optimized filter will provide the processed digital audio signal 59. Each time a digital audio signal is processed, the window counter is decremented 60. The process of the next arriving digital audio data value can start. The number of digital audio signal values selected from the transient optimized filter depends on the time for which the frequency optimized filter might output a digital audio signal with a ringing component. As soon as the counter reaches ZERO and no new transient condition was detected operation returns to selecting the processed digital audio signal value from the frequency optimized filter.

It is considered to be within the expected skill of an artisan in the field of digital audio signal processing to substitute different processing means for performing the above disclosed operation, as well as performing some of the steps in a different sequence or concurrently to improve speed, performance and reduce cost.

What we claim is:

1. Method for reducing signal distortion in the neighborhood of transitions in a digital audio system having a digital input signal including successive digital data values comprising the steps of entering said digital data values;

storing said digital data values in a first storage for providing said successive digital data values, and in a second storage for providing a delayed digital data value for each said digital data value;

subtracting each of said digital data values from the associated next one of said successive digital data values, thereby generating successive absolute difference values;

storing said absolute difference values in a third storage and providing a previous absolute difference value;

subtracting the stored previously generated one of said absolute difference values from the present one of said absolute difference values and generating a relative difference value;

determining the sign of said relative difference value as indicator for the occurrence of one of said transitions, setting a timing counter to a predetermined value, and starting said timing counter if said sign is positive;

processing said delayed digital input data values stored in said second storage in a frequency optimized filter for providing a first processed data value, and in a transient optimized filter for providing a second processed data value;

generating a digital audio output signal by selecting said first processed data value while said counter is not counting, and selecting said second processed data value while said counter is counting, wherein said counter steps proportionally to the number of said so selected second processed data values wherein said predetermined value corresponds to the number of said first processed data values distortable by the occurrence of one of said transitions wherein said digital audio input is interpolated with a conventional frequency optimized filter until said transient information is detected, and wherein the digital input is interpolated with said transient optimized filter upon detection of said transient.

2. An adaptive digital audio interpolation system receiving a digital audio input and providing an interpolated digital audio output, said system comprising a frequency optimized interpolation filter circuit;

a transient optimized interpolation filter circuit;

a transient detection circuit for detecting a transient and generating a selection control signal;

said frequency optimized interpolation filter, said transient optimized interpolation circuit, and said transient detection circuit receiving said digital audio input;

an output signal selection circuit connected to said frequency optimized interpolation filter circuit and said transient optimized interpolation circuit, receiving said selection control signal, and providing said interpolated digital audio output wherein said digital audio input includes digital audio data, and wherein said transient detection circuit detects said transient in said digital audio input by comparing successive ones of said digital audio data wherein said transient detection circuit activates said output selection circuit to provide said interpolated digital audio output from said transient optimized interpolation filter if said transient has been detected, and to provide said interpolated digital audio output from said frequency optimized interpolation filter if said transient has not been detected.

* * * * *